(12) United States Patent
Sung et al.

(10) Patent No.: US 8,368,378 B2
(45) Date of Patent: Feb. 5, 2013

(54) PLASMA MEASUREMENT DEVICE, PLASMA SYSTEM, AND METHOD FOR MEASURING PLASMA CHARACTERISTICS

(75) Inventors: Ta-Lun Sung, Taoyuan County (TW); Chung-Ming Liu, Taoyuan County (TW); Kuen Ting, Taoyuan County (TW); Shosaku Matsumura, Taoyuan County (TW); Shinriki Teii, Taoyuan (TW)

(73) Assignee: Lunghwa University of Science and Technology, Taoyuan County (TW)

( * ) Notice: Subject to any disclaimer, the term of this patent is extended or adjusted under 35 U.S.C. 154(b) by 427 days.

(21) Appl. No.: 12/694,412

(22) Filed: Jan. 27, 2010

(65) Prior Publication Data

US 2011/0001465 A1      Jan. 6, 2011

(30) Foreign Application Priority Data

Jul. 3, 2009   (TW) .............................. 98122588 A

(51) Int. Cl.
*G01N 27/66* (2006.01)
(52) U.S. Cl. .................................. 324/71.1; 324/750.28
(58) Field of Classification Search ................. 324/71.1, 324/158.1, 750.28
See application file for complete search history.

(56) References Cited

U.S. PATENT DOCUMENTS 5,339,039 A * 8/1994 Carlile et al. ................. 324/655

FOREIGN PATENT DOCUMENTS

KR       2006110653 A * 10/2006

* cited by examiner

*Primary Examiner* — Vincent Q Nguyen
(74) *Attorney, Agent, or Firm* — Alan Kamrath; Kamrath IP Lawfirm, P.A.

(57) ABSTRACT

A plasma measurement device used for measuring plasma characteristics of radio frequency plasma a probe, a connector electronic wire, and a power supply device. The probe is used for entering the radio frequency plasma to measure the plasma characteristics. One end of the connector electronic wire is electrically connected to the probe. The power supply device is electrically connected to another end of the connector electronic wire, and the power supply device is used for providing a voltage to the probe. The connector electronic wire is a specific length, and the connector electronic wire and the radio frequency plasma would generate a standing wave effect. Thus, according to the standing wave effect, the plasma measurement device could eliminate high-frequency interference generated by the radio frequency plasma while measuring the plasma characteristics.

20 Claims, 5 Drawing Sheets

PLASMA MEASUREMENT DEVICE, PLASMA SYSTEM, AND METHOD FOR MEASURING PLASMA CHARACTERISTICS

BACKGROUND OF THE INVENTION

1. Field of the Invention

The present invention relates to a plasma measurement device, a plasma system and a method for measuring plasma characteristics. More particularly, the present invention relates to a plasma measurement device, a plasma system and a method for measuring plasma characteristics by utilizing a standing wave effect to eliminate high-frequency interference generated by the radio frequency plasma.

2. Description of the Related Art

Generally, a single-electrode Langmuir probe utilizes a tiny-surface-area metal electrode as a signal extraction tool. The probe is placed in a plasma system and is connected to a voltage supply system. By operating the voltage supply system and providing a frequency-sweep potential to the probe (such as providing adjustable direct-current voltages from −50V to 50V to the probe), the probe can extract current signals according to different potentials of its own. By depicting measured voltage-current results, a voltage-current characteristic curve can be obtained, and plasma characteristics (such as an electron temperature or an electron density) can therefore be calculated. However, the measured voltage-current curve would be distorted due to high-frequency interference.

In known prior arts, a compensation circuit is added to the circuit of the single-electrode Langmuir probe to reduce the influence from high-frequency signals. However, this kind of implementation cannot be done without a circuit design, which causes inconvenience to those who are not familiar with circuit designs.

Therefore, there is a need to provide a plasma measurement device, a plasma system, and a method for measuring plasma characteristics to mitigate and/or obviate the aforementioned problems.

SUMMARY OF THE INVENTION

It is an object of the present invention to provide a plasma measurement device, a plasma system and a method for measuring plasma characteristics. Therefore, according to a standing wave effect, the present invention can eliminate high-frequency interference generated by radio frequency plasma while measuring the plasma characteristics.

To achieve the abovementioned object, the present invention provides a plasma measurement device, used for measuring plasma characteristics of radio frequency plasma. The plasma measurement device comprises a probe, a connector electronic wire and a power supply device. The probe is used for entering the radio frequency plasma to measure the plasma characteristics. One end of the connector electronic wire is electrically connected to the probe. The power supply device is electrically connected to another end of the connector electronic wire, and the power supply device is used for providing a voltage to the probe. The connector electronic wire is a specific length, and the connector electronic wire and the radio frequency plasma would generate a standing wave effect. Thus, according to the standing wave effect, the plasma measurement device could eliminate high-frequency interference generated by the radio frequency plasma while measuring the plasma characteristics.

In one embodiment of the present invention, the probe is a single-electrode Langmuir probe.

In one embodiment of the present invention, the specific length of the connector electronic wire is substantially one-fourth as long as a wavelength of the radio frequency plasma.

To achieve the abovementioned object, the present invention also provides a method for measuring plasma characteristics, which comprises the following steps: providing radio frequency plasma; providing a plasma measurement device, with the plasma measurement device comprising a probe and a connector electronic wire, and with the probe and the connector electronic wire electrically connected to each other; adjusting a specific length of the connector electronic wire; and measuring the plasma characteristics. Accordingly, the connector electronic wire and the radio frequency plasma would generate a standing wave effect. Thus, according to the standing wave effect, the plasma measurement device could eliminate high-frequency interference generated by the radio frequency plasma while measuring the plasma characteristics.

To achieve the abovementioned object, the present invention also provides a method for measuring plasma characteristics, which comprises the following steps: providing radio frequency plasma; providing a plasma measurement device, wherein the plasma measurement device comprises a probe and a connector electronic wire, and the probe and the connector electronic wire are electrically connected to each other; adjusting a specific length of the connector electronic wire; and measuring the plasma characteristics. Accordingly, the connector electronic wire and the radio frequency plasma would generate a standing wave effect, such that according to the standing wave effect, the plasma measurement device could eliminate high-frequency interference generated by the radio frequency plasma while measuring the plasma characteristics.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, similar reference numerals denote similar elements throughout the several views.

DETAILED DESCRIPTION OF THE PREFERRED EMBODIMENTS

Figure 1:
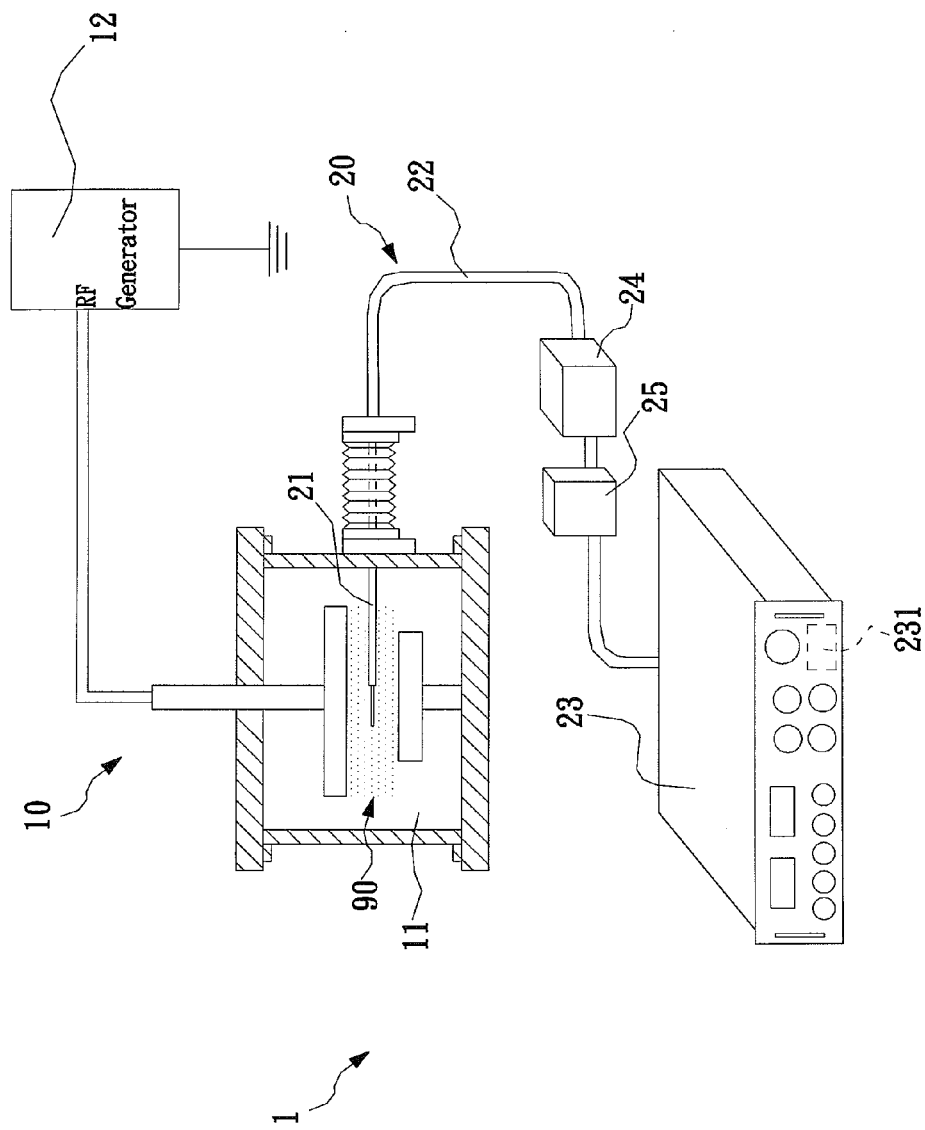
FIG. 1 illustrates a hardware architecture diagram of a plasma system and a plasma measurement device according to the present invention.

Please refer to FIG. 1, which illustrates a hardware architecture diagram of a plasma system and a plasma measurement device according to one embodiment of the present invention.

As shown in FIG. 1, the plasma system 1 of the present invention comprises a plasma device 10 and a plasma measurement device 20. The plasma device 10 comprises a plasma chamber 11 and a radio frequency generator 12. The radio frequency generator 12 is used for providing energy required for generating radio frequency plasma 90 in the plasma chamber 11.

In one embodiment of the present invention, the plasma measurement device 20 is used for measuring plasma characteristics of the radio frequency plasma 90. The plasma measurement device 20 comprises a probe 21, a connector electronic wire 22, an adjustment device 24, a low-pass filter 25 and a power supply device 23. In one embodiment of the present invention, the power supply device 23 comprises a signal extraction device 231, and the signal extraction device 231 is used for receiving, but not limited to, voltage signals and current signals. For example, the signal extraction device can also be installed in the outside of the power supply device (for example, the signal extraction device can be an external current meter), and is electrically connected to the power supply device and the connector electronic wire (not shown in FIG. 1).

Figure 2:
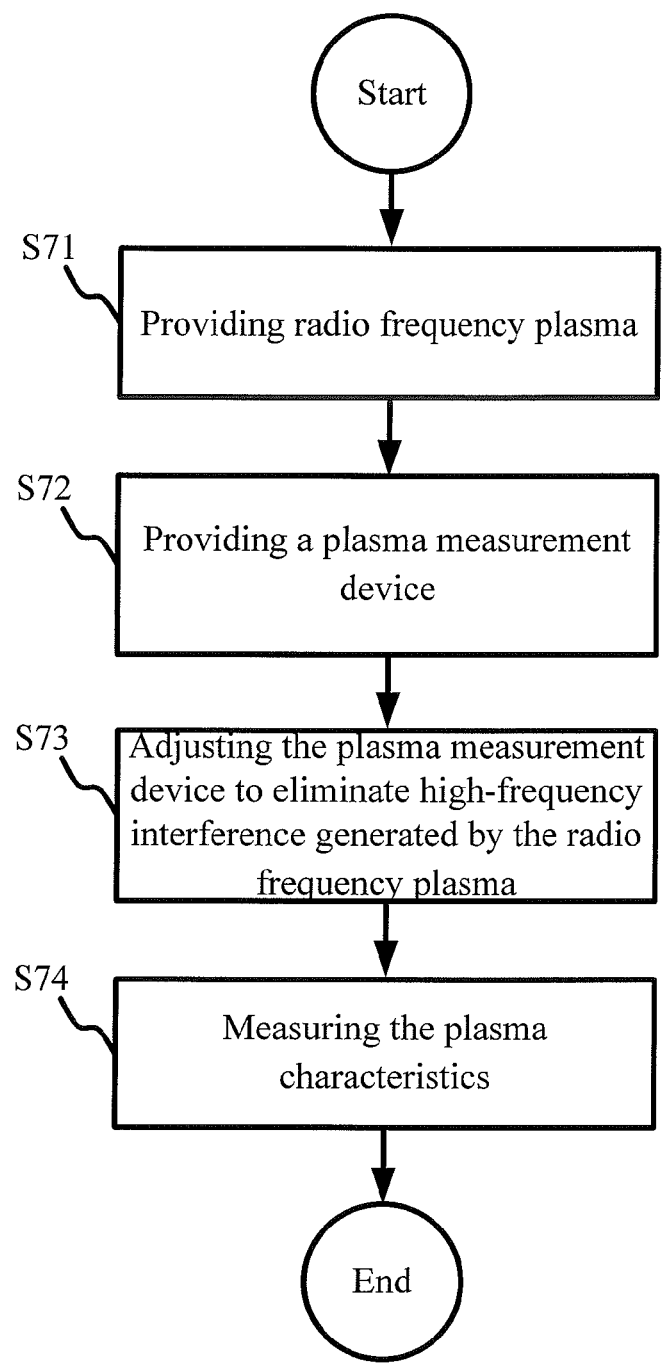
FIG. 2 illustrates a flowchart of a method for measuring plasma characteristics according to the present invention.

Please refer to both FIG. 1 and FIG. 2, with FIG. 2 illustrating a flowchart of a method for measuring plasma characteristics according to one embodiment of the present invention.

As shown in FIG. 2, the method for measuring plasma characteristics of the present invention firstly performs step S71: providing radio frequency plasma.

In one embodiment of the present invention, the radio frequency generator 12 is used for generating the radio frequency plasma at, but not limited to, 13.56MHz. Then, the method of the present invention performs step S72: providing a plasma measurement device.

As shown in FIG. 1, in one embodiment of the present invention, the probe 21 is used for entering the radio frequency plasma 90 to measure the plasma characteristics. In one embodiment of the present invention, the probe 21 is, but not limited to, a single-electrode Langmuir probe. One end of the connector electronic wire 22 is electrically connected to the probe 21, and the connector electronic wire 22 is a specific length. In one embodiment of the present invention, the connector electronic wire 22 is, but not limited to, a coaxial cable. The adjustment device 24 is used for adjusting the specific length of the connector electronic wire 22. The power supply device 23 is electrically connected to another end of the connector electronic wire 22, and the power supply device 23 is used for providing a voltage to the probe 21. In one embodiment of the present invention, the voltage provided from the power supply device 23 to the probe 21 is substantially between −40 volts and +40 volts, but please note that the scope of the present invention is not limited to the above description.

Then, the method of the present invention performs step S73: adjusting the plasma measurement device to eliminate high-frequency interference generated by the radio frequency plasma.

Figure 3:
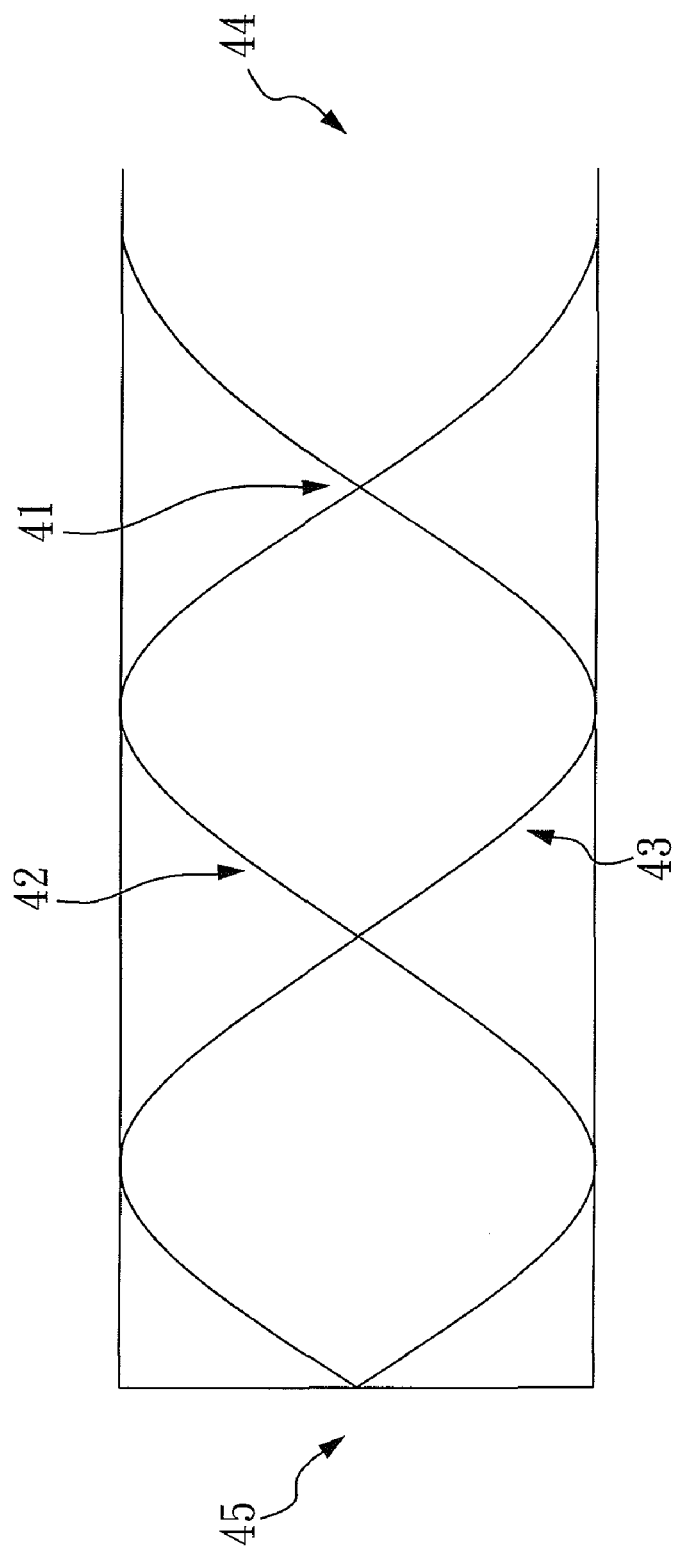
FIG. 3 illustrates a schematic drawing of a standing wave of the method for measuring plasma characteristics according to the present invention.

In one embodiment of the present invention, the connector electronic wire 22 and the power supply device 23 would generate a standing wave effect with the radio frequency plasma 90. When two waves of equal amplitude and frequency are travelling in opposite directions, a standing wave would occur accordingly. When these two waves are travelling, certain dots not moving with the waves are called nodes. As shown in FIG. 3, a node 41 would not move up and down due to the transmission of the waves. More precisely, the node 41 receives minimum energy interference. Within a travelling range of two waves 42 and 43, if one end is a free end 44 and the other end is a closed end 45, then, the first position of generating the node 41 would be located one-fourth of the wavelength from the free end 44.

In order to eliminate high-frequency interference generated by the radio frequency plasma 90, the specific length of the connector electronic wire 22 of the present invention is preferably designed as one-fourth as long as the wavelength of the radio frequency plasma 90.

In one embodiment of the present invention, the radio frequency of the radio frequency plasma 90 is 13.56 MHz. Therefore, the wavelength $\lambda$ of the radio frequency plasma 90 is: $\lambda = C/v = (299{,}792{,}458 \text{ m/s})/(13.6 \times 10^6 \text{/s}) = 22.109$ m; wherein $\lambda$ is the wavelength measured in meters (m); C is the velocity of light measured in meter/second (m/s); and v is the frequency measured in 1/second (1/s). Therefore, in one embodiment of the present invention, one-fourth of the wavelength is 551 centimeters (cm).

In one embodiment of the present invention, the specific length of the connector electronic wire 22 is substantially between, but not limited to, 500 centimeters and 600 centimeters.

In one embodiment of the present invention, the design of one-fourth of the wavelength might be varied under practical situations. Therefore, the adjustment device 24 is capable of adjusting the specific length of the connector electronic wire 22 to meet the practical situation.

In one embodiment of the present invention, the low-pass filter 25 is electrically connected to the power supply device 23. The low-pass filter 25 is used for adjusting the wavelength of the standing wave, to keep the specific length in one-fourth of the wavelength.

Finally, the method of the present invention performs step S74: measuring plasma characteristics.

In one embodiment of the present invention, the plasma characteristics comprise, but not limited to, an electron temperature or an electron density.

In one embodiment of the present invention, after the probe 21 enters the radio frequency plasma 90, the signal extraction device 231 would record current values at different voltages measured by the probe 21, to depict a current-voltage curve. According to the current-voltage curve and known equations, the plasma characteristics can therefore be calculated. Because associating the known equations with the current-voltage curve to obtain the electron temperature or the electron density is a known technique, there is no need to describe the calculation process in detail.

Figure 4:
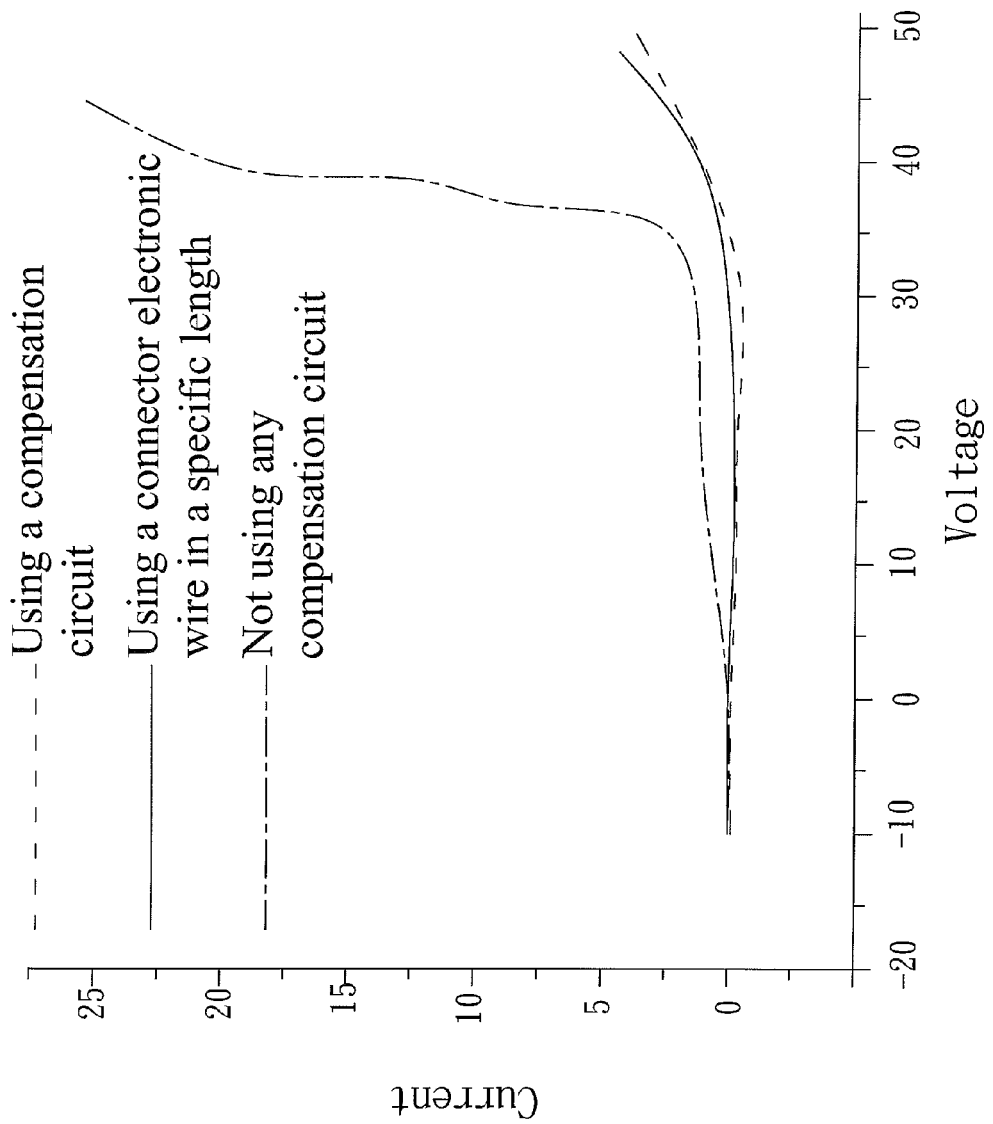
FIG. 4 illustrates voltage-current curves measured under the conditions of: not using a compensation circuit, using a compensation circuit, and using the plasma measurement device of the present invention.
Figure 5:
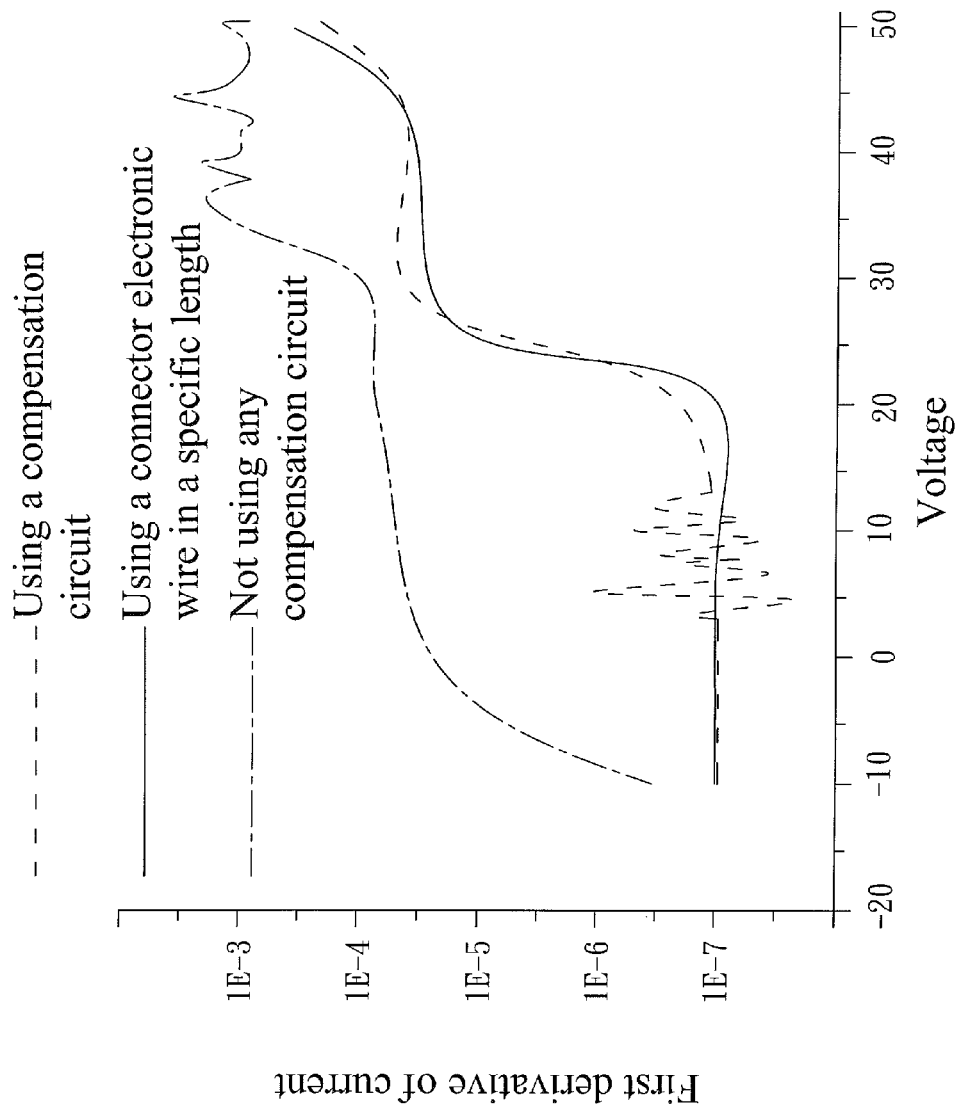
FIG. 5 illustrates voltage-"first derivative of current" curves measured under the conditions of: not using a compensation circuit, using a compensation circuit, and using the plasma measurement device of the present invention.

Please refer to FIG. 4 and FIG. 5 showing actual results measured by the plasma measurement device according to the present invention.

In one embodiment of the present invention, the plasma chamber is a radio frequency flat-panel chamber with its plasma power at 150 watts, bias at 88 volts, in-chamber pressure at 249 mTorr, and gas flow at 25 sccm (standard cubic centimeter per minute), with Argon (Ar) gas used.

Please refer to FIG. 4, which illustrates voltage-current curves measured under the conditions of: not using a compensation circuit, using a compensation circuit, and using the plasma measurement device of the present invention. The vertical axis represents current values measured in milliamps (mA), and the horizontal axis represents voltages measured in volts (V). Please refer to FIG. 5, which illustrates voltage-"first derivative of current" curves depicted according to the voltage-current curves as shown in FIG. 4. The vertical axis represents first derivatives of current values, and the horizontal axis represents voltages. According to FIG. 4 and FIG. 5, the voltage-current curve measured by the plasma measurement device of the present invention is very close to the voltage-current curve measured under the condition of using a compensation circuit. Thus, the plasma measurement device of the present invention can successfully eliminate the high-frequency interference.

Although the present invention has been explained in relation to its preferred embodiments, it is to be understood that many other possible modifications and variations can be made without departing from the spirit and scope of the invention as hereinafter claimed.

What is claimed is:

1. A plasma measurement device used for measuring plasma characteristics of radio frequency plasma, with the plasma measurement device comprising:
    a probe used for entering the radio frequency plasma to measure the plasma characteristics;
    a connector electronic wire, wherein one end of the connector electronic wire is electrically connected to the probe; and
    a power supply device electrically connected to another end of the connector electronic wire, wherein the power supply device provides a voltage to the probe;
    wherein the connector electronic wire is a specific length, wherein the connector electronic wire and the radio frequency plasma generates a standing wave effect, and wherein according to the standing wave effect, the plasma measurement device eliminates high-frequency interference generated by the radio frequency plasma while measuring the plasma characteristics.

2. The plasma measurement device as claimed in claim 1, wherein the probe is a single-electrode Langmuir probe.

3. The plasma measurement device as claimed in claim 1, wherein the specific length is substantially one-fourth as long as a wavelength of the radio frequency plasma.

4. The plasma measurement device as claimed in claim 1 further comprising an adjustment device adjusting the specific length of the conductor electronic wire.

5. The plasma measurement device as claimed in claim 1 further comprising a low-pass filter electrically connected to the power supply device.

6. The plasma measurement device as claimed in claim 1, wherein the power supply device comprises a signal extraction device receiving a voltage signal and a current signal.

7. The plasma measurement device as claimed in claim 1 further comprising a signal extraction device receiving a voltage signal and a current signal.

8. The plasma measurement device as claimed in claim 1, wherein the radio frequency plasma is at 13.56 MHz.

9. The plasma measurement device as claimed in claim 8, wherein the specific length of the connector electronic wire is substantially between 500 centimeters and 600 centimeters.

10. The plasma measurement device as claimed in claim 1, wherein the plasma characteristics comprise an electron temperature or an electron density.

11. The plasma measurement device as claimed in claim 1, wherein the connector electronic wire is a coaxial cable.

12. The plasma measurement device as claimed in claim 1, wherein the voltage is substantially between −40 volts and +40 volts.

13. A plasma system comprising:
    a plasma device comprising:
        a plasma chamber; and
        a radio frequency generator providing energy required for generating radio frequency plasma in the plasma chamber;
    and
    a plasma measurement device measuring plasma characteristics of the radio frequency plasma and comprising:
        a probe entering the radio frequency plasma to measure the plasma characteristics, wherein the probe is a single-electrode Langmuir probe;
        a connector electronic wire, wherein one end of the connector electronic wire is electrically connected to the probe; and
        a power supply device electrically connected to another end of the connector electronic wire, wherein the power supply device provides a voltage to the probe;
    wherein the connector electronic wire is a specific length, wherein the connector electronic wire and the radio frequency plasma generates a standing wave effect, and wherein according to the standing wave effect, the plasma measurement device eliminates high-frequency interference generated by the radio frequency plasma while measuring the plasma characteristics.

14. The plasma system as claimed in claim 13, wherein the specific length is substantially one-fourth as long as a wavelength of the radio frequency plasma.

15. A method for measuring plasma characteristics comprising:
    providing radio frequency plasma;
    providing a plasma measurement device, wherein the plasma measurement device comprises a probe and a connector electronic wire, wherein the probe and the connector electronic wire are electrically connected to each other;
    adjusting the plasma measurement device to eliminate high-frequency interference generated by the radio frequency plasma comprises adjusting a specific length of the connector electronic wire to eliminate the high-frequency interference generated by the radio frequency plasma; and
    measuring the plasma characteristics.

16. The method for measuring plasma characteristics as claimed in claim 15, wherein the probe is a single-electrode Langmuir probe.

17. The method for measuring plasma characteristics as claimed in claim 15, wherein the specific length is substantially one-fourth as long as a wavelength of the radio frequency plasma.

18. The method for measuring plasma characteristics as claimed in claim 15, wherein the radio frequency plasma is at 13.56 MHz.

19. The method for measuring plasma characteristics as claimed in claim 18, wherein the specific length of the connector electronic wire is substantially between 500 centimeters and 600 centimeters.

20. The method for measuring plasma characteristics as claimed in claim 15, wherein the plasma characteristics comprise an electron temperature or an electron density.

* * * * *